United States Patent
Chang et al.

(10) Patent No.: US 6,346,449 B1
(45) Date of Patent: Feb. 12, 2002

(54) NON-DISTORT SPACER PROFILE DURING SUBSEQUENT PROCESSING

(75) Inventors: Tzong-Sheng Chang, Chang-Hua; Shih-Chang Huang, Hsin-Chu; Bor-Zen Tien, Shang-Shung; Chen Cheng Chou, Taichung, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/312,599

(22) Filed: May 17, 1999

(51) Int. Cl.[7] ............... H01L 21/331; H01L 21/336; H01L 21/4763
(52) U.S. Cl. ............. 438/305; 438/595; 438/307
(58) Field of Search ............. 438/296, 303, 438/282, 283, 305, 595

(56) References Cited

U.S. PATENT DOCUMENTS

| | | | |
|---|---|---|---|
| 4,755,479 A | * 7/1988 | Miura | 437/44 |
| 4,786,609 A | * 11/1988 | Chen | 437/30 |
| 5,384,285 A | 1/1995 | Sitaram et al. | 437/200 |
| 5,451,546 A | 9/1995 | Grubisich et al. | 437/200 |
| 5,605,854 A | 2/1997 | Yoo | 437/44 |
| 5,668,024 A | 9/1997 | Tsai et al. | 438/199 |
| 5,731,239 A | 3/1998 | Wong et al. | 438/296 |
| 5,783,479 A | * 7/1998 | Lin et al. | 438/592 |
| 5,882,975 A | * 3/1999 | Ishikawa | 438/303 |
| 5,918,141 A | * 6/1999 | Merrill | 438/583 |
| 5,923,986 A | 7/1999 | Shen | 438/303 |
| 5,998,849 A | * 12/1999 | Ishimaru et al. | 257/410 |
| 6,051,863 A | * 4/2000 | Hause et al. | 257/369 |
| 6,075,274 A | * 6/2000 | Wu et al. | 257/413 |

OTHER PUBLICATIONS

Richard C. Jaeger, Intro to Microelectronic Fabrication, vol. V, page 20.*

* cited by examiner

Primary Examiner—Olik Chaudhuri
Assistant Examiner—Steven H. Rao
(74) Attorney, Agent, or Firm—George O. Saile; Stephen B. Ackerman; William J. Stoffel

(57) ABSTRACT

A method for fabricating a junction for a field effect transistor which does not cause distortion of the sidewall spacers during subsequent processing thereby reducing junction depletion and source to drain leakage. The process begins by providing a substrate structure having a gate thereon. Sidewall spacers are formed on the sidewalls of the gate. Impurity ions are implanted into the substrate structure adjacent to the gate to form source and drain regions. A resist protect oxide layer is formed over the substrate structure. The resist protect oxide is patterned by forming a mask over the resist protect oxide layer having an opening over the gate and the source and drain regions. The resist protect oxide layer is selectively etched; thereby removing the resist protect oxide over the source and drain regions without distorting the sidewall spacers. A silicide region is formed on the source and drain regions using a salicide process comprising a pre-amorphous implant and one or more rapid thermal anneal steps. The undistorted sidewall spacers reduce the distance that pre-amorphous implant damage extends under the gate during subsequent processing, which reduces the damage induced impurity ion diffusion under the gate. Because there is less impurity ion diffusion under the gate, junction depletion and source to drain leakage are reduced.

11 Claims, 3 Drawing Sheets

NON-DISTORT SPACER PROFILE DURING SUBSEQUENT PROCESSING

BACKGROUND OF INVENTION

1) Field of the Invention

This invention relates generally to fabrication of semiconductor devices and more particularly to a method of fabricating a junction in which spacer profile is not distorted by subsequent processing such as screen oxide etch and pre-amorphization implant and anneal.

2) Description of the Prior Art

In sub-micron semiconductor technology, the use of self-aligned silicide processes have become widely accepted to minimize device series resistance and to tighten the design rule. Titanium silicide is the dominant material. The use of pre-amorphous implants for relieving stress-retarded reaction and increasing nucleation density is known.

However, the inventors have found that the integration of logic and memory on a single substrate has led to an increase in the quantity of etch steps after spacer formation. The inventors have found that these etch steps induce spacer deformation resulting in a triangular spacer profile and a loss of spacer width.

The importance of overcoming the various deficiencies noted above is evidenced by the extensive technological development directed to the subject, as documented by the relevant patent and technical literature. The closest and apparently more relevant technical developments in the patent literature can be gleaned by considering the following patents.

U.S. Pat. No. 5,731,239 (Wong et al.) shows an oxide layer over the STI during the gate silicide process.

U.S. Pat. No. 5,451,546 (Grubisich et al.) shows a masking method for a salicide process to prevent damage to oxide spacers.

U.S. Pat. No. 5,384,285 (Sitaram et al.) teaches a salicide process with a selective wet etch using $H_2SO_4+H_2O_2$ or $NH_4OH+H_2O_2$.

U.S. Pat. No. 5,605,854 (Yoo) shows a titanium silicide process integrated with a tungsten plug.

U.S. Pat. No. 5,668,024 (Tsai et al.) teaches a salicide process with dual spacers.

SUMMARY OF THE INVENTION

It is an object of the present invention to provide a method for fabricating a junction for a field effect transistor which does not cause distortion of the sidewall spacers.

It is another object of the present invention to provide a method for fabricating a junction for a field effect transistor which reduces source to drain leakage.

It is another object of the present invention to provide a method for fabricating a junction for a field effect transistor which reduces junction depletion.

It is another object of the present invention to provide a method for fabricating a junction for a field effect transistor which reduces the polymer on active regions and the poly-silicon gate, while forming a pure titanium silicide.

It is yet another object of the present invention to provide a method for fabricating a junction for a field effect transistor which reduces source to drain leakage and junction depletion without forming multiple spacers on each sidewall of a gate.

To accomplish the above objectives, the present invention provides a method for fabricating a junction for a field effect transistor which does not cause distortion of the sidewall spacers during subsequent processing thereby reducing junction depletion and source to drain leakage. The invention uses a key selective etch for the etch of the resist protect oxide layer having a high selectivity between the silicon nitride spacer and the TEOS resist protect oxide layer. This etch does not significantly etch (or distort) the spacer.

The process begins by providing a substrate structure having a gate thereon. Sidewall spacers are formed on the sidewalls of the gate. Impurity ions are implanted into the substrate structure adjacent to the gate to form source and drain regions. A resist protect oxide layer is formed over the substrate structure. The resist protect oxide is patterned by forming a mask over the resist protect oxide layer having an opening over the gate and the source and drain regions. The resist protect oxide layer is selectively etched; thereby removing the resist protect oxide over the source and drain regions without distorting the sidewall spacers. A silicide region is formed on the source and drain regions using a salicide process comprising a pre-amorphous implant and one or more rapid thermal anneal steps.

The present invention provides considerable improvement over the prior art. The undistorted sidewall spacers reduce the distance that pre-amorphous implant damage extends under the gate during subsequent processing, which reduces the damage induced impurity ion diffusion under the gate. Because there is less impurity ion diffusion under the gate, junction depletion and source to drain leakage are reduced. Because the sidewall spacers are not distorted, additional spacers are not required to protect the substrate under the gate.

Since a typical dry etching process has more $CHF_3$ gas than the etch of the present invention, this gas will react with the silicon in the active areas and on the polysilicon gate to form a polymer. This polymer impedes titanium silicide formation in these areas. The etch of the present invention reduces this problem by reducing the amount of $CHF_3$ gas that these areas are exposed to.

The present invention achieves these benefits in the context of known process technology. However, a further understanding of the nature and advantages of the present invention may be realized by reference to the latter portions of the specification and attached drawings.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE INVENTION

The present invention will be described in detail with reference to the accompanying drawings. The invention provides a method for fabricating a sidewall spacer (20) that is resistant to distortion during subsequent processing, particularly pre-amorphous implant and rapid thermal anneal steps associated with silicide formation.

Problem the Invention Solves—FIGS. 1 through 4

Figure 1:
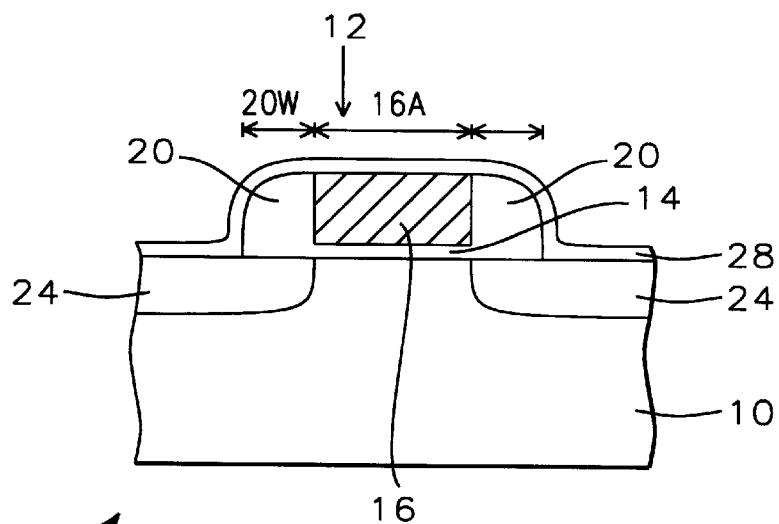
FIG. 1 illustrates a sectional view of a substrate structure having thereon a gate, sidewall spacers, source and drain regions and a resist protect oxide layer as is known in the art.
Figure 2:
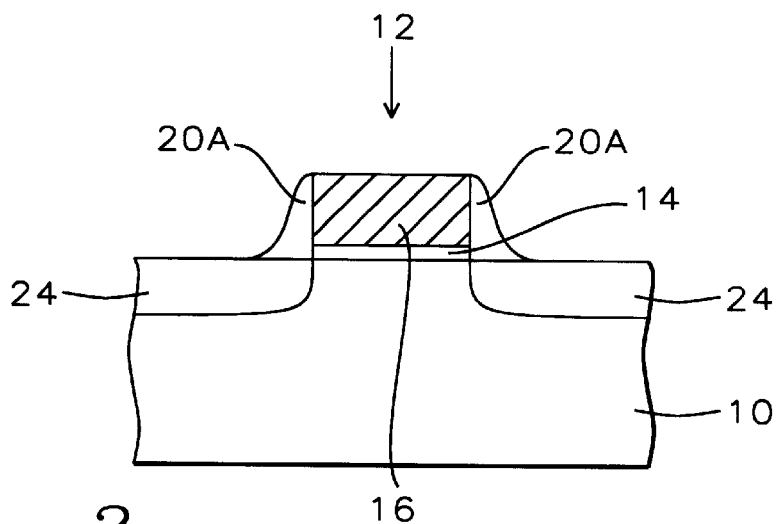
FIGS. 2, 3 & 4 illustrate sequential sectional views of a current process for etching the resist protect oxide layer and forming silicide on the source and drain regions which results in sidewall spacer distortion, junction depletion and source to drain leakage.

FIGS. 1 through 4 show a process that the inventor found to have a problem. The problem was that the spacer (20) was excessively etched and made thinner. (FIG. 2 shows the gate 20A that is thinned by excessive etching). Then, the ion implant of the pre-amorphous implant was implanted closer to and under the gate (12) causing leakage current. The problem is caused and/or worsened by (1) additional spacer etches on the logic devices (especially dry etches); (2) pre-amorphous ion implants (PAI I/I); and (3) silicide/salicide processes.

Referring to FIG. 1, the process begins by providing a substrate structure (10) for a semiconductor device composed of monocrystalline silicon. The substrate structure (10) has thereon a gate (12) with sidewalls. The gate (12) comprises a gate oxide layer (14) and a gate electrode layer (16). The gate electrode layer (16) preferably has a width (16A) of between about 0.15 microns and 0.35 microns. As technology improves, gate electrode widths (16A) and channel widths decrease, thus making the devices more sensitive to leakage currents. Because the inventors' process has narrow gate widths, the process is particularly sensitive to problems such as a thinning spacer (20A).

Lightly doped source and drains (LDD) are formed in the substrate adjacent to the gate. Both N-MOS and P-MOS devices can be formed with LDD's by using masking and ion implant steps.

Still referring to FIG. 1, spacers (20) are formed on the sidewalls of the gate (12). The spacers preferably have a width (20W) of between about 0.07 microns and 0.15 microns.

Still referring to FIG. 1, impurity ions are implanted into the substrate structure (10) adjacent to the gate (12) to form source and drain regions (24). The impurity ion species can be N-type or P-type depending on the polarity of the device being manufactured (NMOS and or PMOS). Devices of both polarities can be made on the substrate structure (10) by masking a first area with a photoresist mask while implanting a first ion species in a second area, then masking the second area while implanting a second ion species in the first area. Embedded logic and memory devices normally have both N-MOS and P-MOS devices.

For an N-type source and drain region (24), the ion species is preferably As+, implanted at an energy of between about 30 KeV and 50 KeV and at a dose of between about $3E15$ atm/cm$^2$ and $5E15$ atm/cm$^2$. For a P-type source and drain region (24), the ion species is preferably BF$_2$+, implanted at an energy of between about 25 KeV and 40 KeV and at a dose of between about $3E15$ atm/cm$^2$ and $5E15$ atm/cm$^2$. A P-well may be formed in the substrate structure (10) prior to forming an N-type source and drain region (24), and an N-well may be formed in the substrate structure (10) prior to forming a P-type source and drain region (24).

For NMOS divices an ESD implant process can also be performed to reduce the susceptibility of the device to electrostatic discharge. The ESD implant can be performed using P+ ions at an energy of between about 15 KeV and 25 Kev, most preferably at about 20 KeV, and at a dose of between about $5E14$ and $1.5E15$ atm/cm$^2$, most preferably at about $1E15$ atm/cm$^2$. The ESD implant process worsens the thin spacer (20A) problem because the dry etch rate of the doped film is much faster than without the implant.

Referring again to FIG. 1, a resist protect oxide (RPO) layer (28) is formed over the substrate structure (10). The resist protect oxide layer (28) can be formed using tetra-ethylorthosilane (TEOS). The RPO layer (28) preferably has a thickness of between about 250 Angstroms and 500 Angstroms.

Referring to FIG. 2, in the older process, when the resist protect oxide layer (28) is patterned, the spacers (20) are also partially etched, resulting in thin spacers (20A) which have become distorted into a triangular shape, having a maximum width at the bottom of between about 0.04 microns and 0.08 microns. The etch removes a width of the spacers of between 0.03 microns and 0.07 microns. An example of an etch that causes the thin spacer (20A) problem is an etch using CF$_4$ and O$_2$ gasses. Thus, the spacers (20) have a width before the RPO etch of between about 0.07 microns and 0.15 microns, but after the RPO etch the thin spacers (20A) have a thickness of between about 0.04 microns and 0.08 microns.

Figure 3:
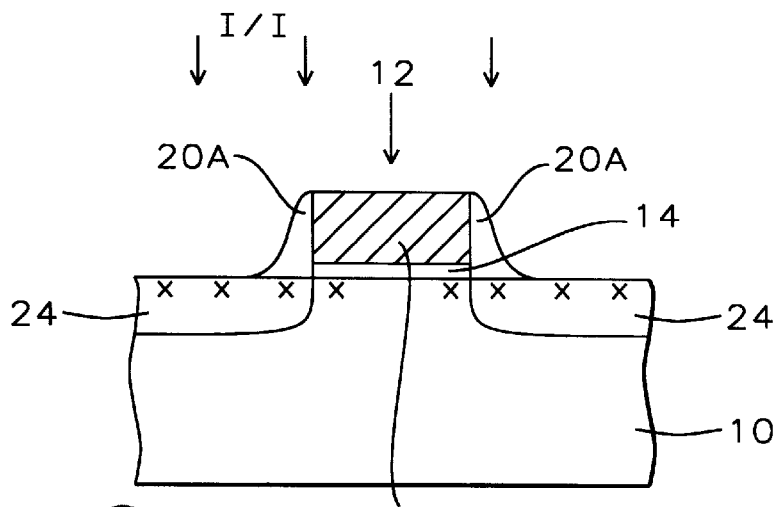

Referring to FIG. 3, a pre-amorphous implant (PAI) is performed to facilitate impurity ion diffusion. However, due to the distortion of the sidewall spacers (20) in the current process, the pre-amorphous implant causes damage to the crystal structure of the silicon which extends under the gate (12).

Figure 4:
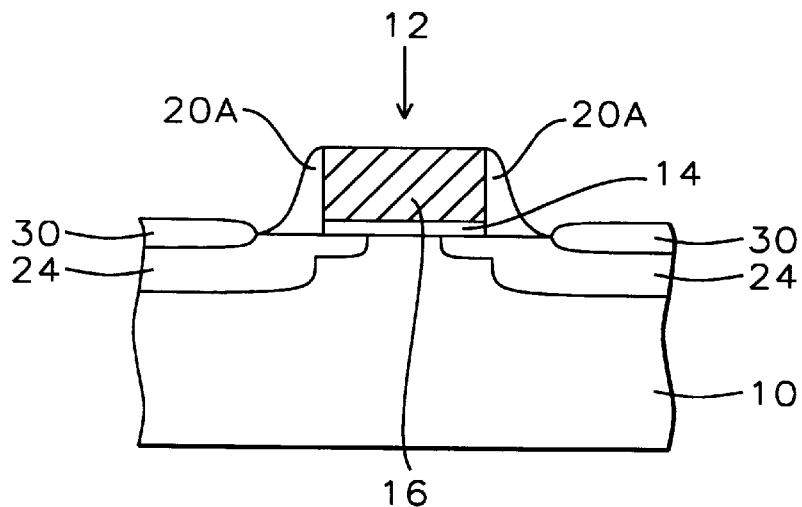

Referring to FIG. 4, a silicide layer (30) is formed on the source and drain regions (24) by depositing a metal layer, preferably titanium, on the source and drain regions (24) and performing one or more rapid thermal anneal steps. The damage to the crystal structure of the substrate structure (10) which extends under the gate (12), causes excess diffusion of the impurity ions in the source and drain regions (24), extending the source and drain regions (24) under the gate (12) and increasing the risk of source to drain leakage, as well as causing junction depletion which increases junction resistance.

Preferred Process of the Present Invention

Figure 5:
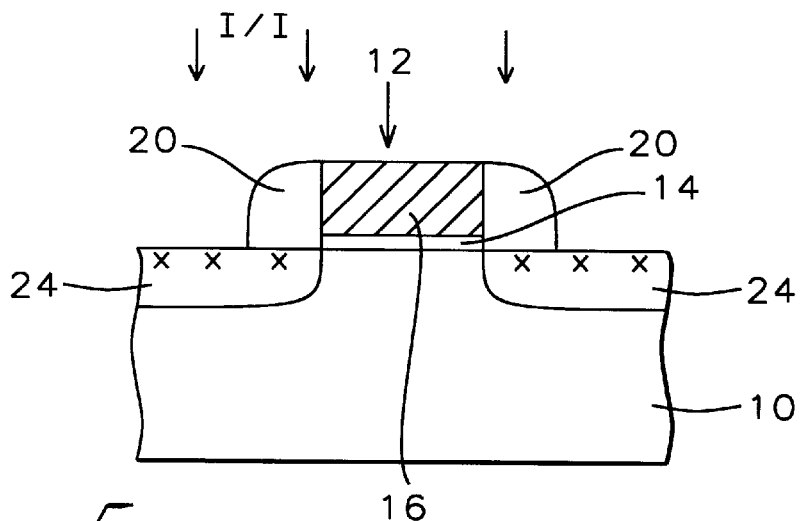
FIGS. 5 & 6 illustrate sequential sectional views of a process for etching the resist protect oxide layer and forming silicide on the source and drain regions without distorting the sidewall spacer according to the invention.
Figure 6:
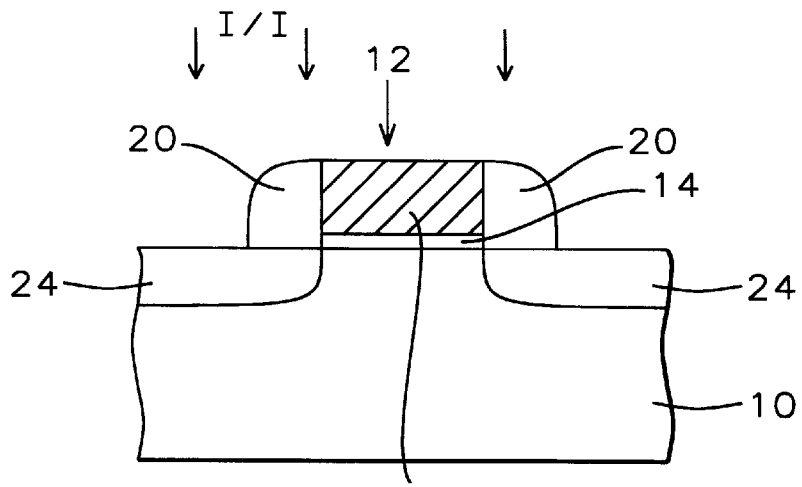

In the process of the present invention, as shown in FIGS. 1, 5 & 6 the thin spacer (20A) problem has been reduced. The invention's process follows the same steps as described above with the important exception of the chemistry of the etch for the RPO layer (28).

Referring again to FIG. 1, a resist protect oxide layer (28) is formed over the gate structure (12). The processes shown in FIG. 1 and described above are the same for the processes of the invention.

The spacers (20) are preferably composed of silicon nitride which can be formed by depositing a silicon nitride layer and anisotropically etching the silicon nitride layer. The gate electrode (16) preferably has a width (16A) of between about 0.15 microns and 0.35 microns. The resist protect oxide layer (28) can be formed using tetraethy-lorthosilane (TEOS). The resist protect oxide layer (28) is patterned to form openings over the source and drain regions (24) on which silicide is to be formed.

To pattern the resist protect oxide layer (28) a mask (not shown) is formed over the resist protect oxide layer (28) having an opening over the gate (12) and the source and drain regions (24). The resist protect oxide layer (28) preferably remains over isolation regions (not shown).

Then, in a key step, the resist protect oxide layer (28) is selectively etched through the opening in the mask. By selectively etching the resist protect oxide layer (28); the resist protect oxide layer (28) is removed over the source and drain regions (24) without distorting the sidewall spacers (20). It is critical to the invention that the RPO etch have a SiN: TEOS oxide selectivity of between 1:5 and 1:10 for a reactive ion etch and a selectivity of between 1:90 and 1:110 for a buffered HF etch. In the invention, the spacers (20) have a width (20W) of between 0.07 microns and 0.15 microns before the RPO etch and a width (20W) of between 0.06 microns and 0.15 microns after the RPO etch.

There are two preferred RPO etches: (1) wet etch using HF with buffered oxide and (2) a dry etch using $CHF_3$ with high $O_2$ and low $H_2$ then $HF_4$ with high $O_2$ and low $H_2$. In the first preferred RPO etch, the resist protect oxide (28) can be removed selectively to the silicon nitride sidewall spacers (20) using a wet etch having a chemistry comprising between about 1% and 5% HF and between about 5% and 10% buffered oxide preferably at a temperature of between about 25° C. and 30° C.

Alternatively, the resist protect oxide (28) can be removed selectively to the silicon nitride sidewall spacers (20) using a reactive ion etch process with a first step having between about 60 atomic % and 80 atomic % $CHF_3$, between about 10 atomic % and 20 atomic % $O_2$, and between about 10 atomic % and 20 atomic % $H_2$, followed by a second step having between about 60 atomic % and 80 atomic % $CHF_4$, between about 10 atomic % and 20 atomic % $O_2$, and between about 10 atomic % and 20 atomic % $H_2$.

Next, a pre-amorphous implant (PAI) is performed to facilitate impurity ion diffusion. However, as shown in FIG. 5, due to the wide spacers (20) in the invention's process, the damage to the crystal structure caused by the pre-amorphous implant does not extend as far under the gate (12) as in the older process. The invention prevents leakage caused by the PAI by maintaining spacer width (20W).

The PAI preferably comprises implanting As+ ions into the gate and substrate at an energy of between about 15 KeV and 30 KeV and a dose of between about $1E14$ $atm/cm^2$ and $8E14$ $atm/cm^2$. Care must be taken not to perform the PAI at too high an energy or at too high a dose because an implant energy or dose higher than these ranges can cause leakage.

Referring to FIG. 6, silicide regions (30) are formed over the source and drain regions (24). The silicide regions (30) are formed using a process well known in the art, comprising: depositing a metal layer, preferably titanium; performing a rapid thermal anneal at a temperature of between about 650° C. and 750° C., preferably 700° C., for a time of between about 15 seconds and 45 seconds, preferably 30 seconds; removing unreated metal residue; and performing a second rapid thermal anneal at a temperature of between about 800° C. and 900° C., preferably 850° C., for a time of between about 15 seconds and 45 seconds, preferably 30 seconds.

The etches of the invention only remove a width of the spacer (20) less than 0.01 Angstroms. In contrast, the etches of the older dry etch process remove a width of the spacer (20) of between 0.04 and 0.08 Angstroms. The selective etch of the present invention maintains the correct spacer width (20W), thereby preventing the PAI ion implant from encrouching under the gate which prevents leakage currents.

The process continues to complete the field effect transistor devices (N-MOS and P-MOS) using processes which are known in the art.

Summary of First and Second RPO Etch Embodiments

Figure 7:
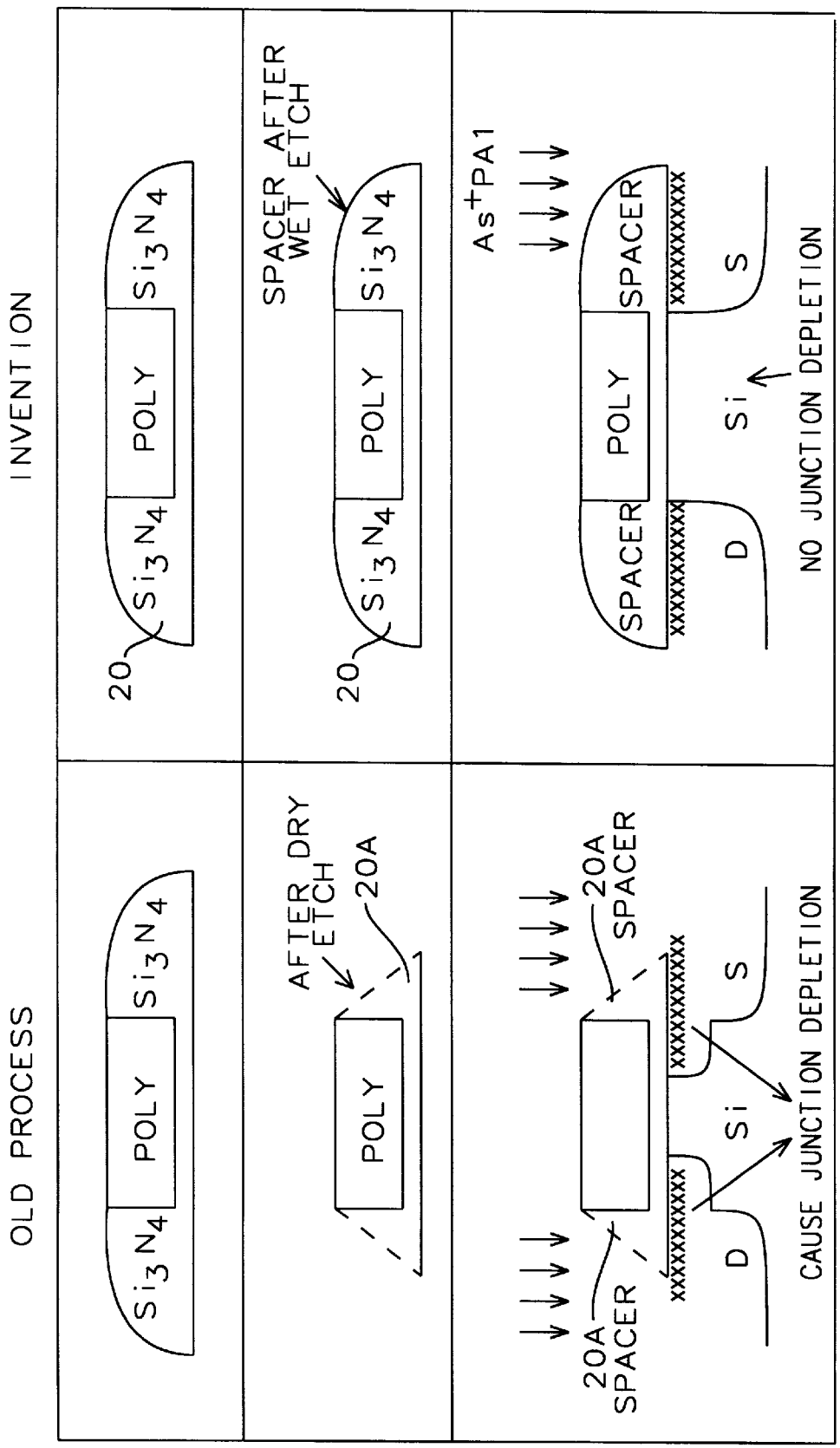
FIG. 7 is a table comparing an older process of the inventors' with the process of the present invention.

FIG. 7 is a table showing a comparison between the older process using a dry RPO etch using $CF_4+O2$ gasses and a process using the selective RPO etch according to the invention. The first row shows the gate structures (12) and spacers (20) which are the same prior to RPO etch. The second row shows the devices after RPO etch. The spacer (20) of the older process is etched (eroded) by the RPO etch resulting in a thin (triagular) spacer (20A). The selective RPO etch of the invention does not significantly etch the silicon nitride spacers (20). The third row shows the devices after the PAI ion implant. The device etched according to the older process with the thin spacers (20A) has junction depletion and leakage. The device etched according to the invention which still has wide spacers (20) does not have junction depletion and leakage between the source and drain.

The process flow for the two preferred embodiments of the present invention are provided in Table 1.

TABLE 1

| process flow | |
|---|---|
| first embodiment | second embodiment |
| SiN spacer | SiN spacer |
| N + implant | N + implant |
| P + implant | P + implant |
| ESD implant | ESD implant |
| screen oxide (RPO) dep. | screen oxide (RPO) dep. |
| selective etch (wet) | selective etch (dry) ($CHF_3$, high $O_2$, |
| (5% to 10% HF, BOE) | low$H_2$ + $CHF_4$, high $O_2$, low $H_2$) |
| pre-metal dip | pre-metal dip |
| As + PAI | As + PAI |
| Ti/TiN dep | Ti/TiN dep |
| RTA-1 | RTA-1 |
| remove unreacted Ti/TiN | remove unreacted Ti/TiN |
| RTA-2 | RTA-2 |

Summary of Benefits

The invention provides a method for etching a RPO TEOS oxide layer using a selective etch. The invention maintains the spacer profile (thickness) that is critical in processes with narrow gates, PAI ion implants and silicide processes that the inventors have found are particularly sensitive to source to drain leakage currents.

The invention provides a method for forming source and drain regions (24), etching a resist protect oxide layer (28) and forming silicide regions on the source and drain regions (24) in which the sidewall spacers (20) are not distorted, thereby preventing junction depletion and source to drain leakage.

While the invention has been particularly shown and described with reference to the preferred embodiments thereof, it will be understood by those skilled in the art that various changes in form and details may be made without departing from the spirit and scope of the invention.

What is claimed is:

1. A method for fabricating a spacer that is resistant to distortion during oxide etch, comprising the steps of:

a. providing a substrate structure having thereon a gate comprising a gate oxide layer and a gate electrode layer; said gate having sidewalls;

b. forming spacers composed of silicon nitride on said sidewalls of said gate;

c. implanting impurity ions into said substrate adjacent to said gate to form source and drain regions;

d. forming a resist protect oxide layer over said substrate structure;

e. forming a mask over said resist protect oxide layer having an opening over said gate and said source and drain regions; and f. etching said resist protect oxide layer selectively to said spacers; thereby removing said resist protect oxide over said source and drain regions without distorting said spacers.

2. The method of claim 1 which further includes, following step f, forming silicide regions over said source and drain regions, including As+ pre-amorphous implantation and one or more rapid thermal anneal steps; whereby the non-distorted sidewall spacers prevent damage caused by the pre-amorphous implant from extending under said gate.

3. The method of claim 1 wherein said spacers are composed of silicon nitride formed using a low pressure chemical vapor deposition (LPCVD) and having a thickness of between about 0.07 microns and 0.15 microns before etching said resist protect oxide layer and having a thickness of between 0.06 microns and 0.15 microns after etching said resist protect oxide layer; and said gate electrode has a width of between 0.15 microns and 0.35 microns; and said resist protect oxide layer is composed of silicon oxide formed using a TEOS process.

4. The method of claim 1 wherein said resist protect oxide is removed using a buffered oxide etch having a chemistry comprising between about 1% and 5% HF and between about 5% and 10% buffered oxide and having a silicon nitride to TEOS oxide etch selectivity of between about 1:90 and 1:110.

5. The method of claim 1 wherein said resist protect oxide is removed using a reactive ion etch process with between about 60 atomic % and 80 atomic % $CHF_3$ with between about 10 atomic % and 20 atomic % $O_2$ and between about 10 atomic % $H_2$, followed by between about 60 atomic % and 80 atomic % $CHF_4$ with between about 10 atomic % and 20 atomic % $O_2$ and between about 10 atomic % $H_2$ having a silicon nitride to TEOS oxide etch selectivity of between 1:5 and 1:10.

6. A method for fabricating a spacer that is resistant to distortion during oxide etch, comprising the steps of:
   a. providing a substrate structure having thereon a gate comprising a gate oxide layer and a gate electrode layer; said gate having sidewalls;
   b. forming spacers composed of silicon nitride on said sidewalls of said gate;
   c. implanting impurity ions into said substrate structure adjacent to said gate to form source and drain regions;
   d. forming a resist protect oxide layer composed of TEOS oxide over said substrate structure;
   e. forming a mask over said resist protect oxide layer having openings over said gate and said source and drain regions;
   f. etching said resist protect oxide layer selectively to said spacers using a wet etch comprising HF and buffered oxide having a silicon nitride to TEOS oxide etch selectivity of between about 1:90 and 1:110; thereby removing said resist protect oxide over said source and drain regions without distorting said spacers;
   g. implanting As+ ions as a pre-amorphous implant into said source and drain regions; whereby the non-distorted spacers reduce the distance that the damage caused by the pre-amorphous implant extends under said gate;
   h. forming a metal layer over said source and drain regions; and
   i. performing one or more rapid thermal anneal steps; whereby the metal layer reacts with underlying silicon from the source and drain regions to form a silicide layer.

7. The method of claim 6 wherein said spacers are composed of silicon nitride and the resist protect oxide etch of step f removes a width of less than 0.01 microns from said spacers.

8. The method of claim 6 wherein said resist protect oxide is removed using a buffered oxide etch having a chemistry comprising between about 1% and 5% HF and between about 5% and 10% buffered oxide.

9. A method for fabricating a spacer that is resistant to distortion during oxide etch, comprising the steps:
   a. providing a substrate structure having thereon a gate comprising a gate oxide layer and a gate electrode layer; said gate having sidewalls;
   b. forming spacers composed of silicon nitride on said sidewalls of said gate;
   c. implanting impurity ions into said substrate structure adjacent to said gate to form source and drain regions;
   d. forming a resist protect oxide layer composed of TEOS oxide over said substrate structure;
   e. forming a mask over said resist protect oxide layer having openings over said gate and said source and drain regions; and
   f. etching said resist protect oxide layer selectively to said spacers using a reactive ion etch with $CHF_3$ with $O_2$ and $H_2$ gasses followed by $CHF_4$ with $O_2$ and $H_2$ having a silicon nitride to TEOS oxide etch selectivity of between about 1:5 and 1:10; thereby removing said resist protect oxide over said source and drain regions without distorting said spacers;
   g. implanting As+ ions as a pre-amorphous implant into said source and drain regions; whereby the non-distorted spacers reduce the distance that the damage caused by the pre-amorphous implant extends under said gate;
   h. forming a metal layer over said source and drain regions; and
   i. performing one or more rapid thermal anneal steps; whereby the metal layer reacts with underlying silicon from the source and drain regions to form a silicide layer.

10. The method of claim 9 wherein said spacers are composed of silicon nitride and the resist protect oxide etch of step f removes a width of less than 0.01 microns from said spacers.

11. The method of claim 9 wherein said resist protect oxide is removed using a reactive ion etch process with between about 60 atomic % and 80 atomic % $CHF_3$ with between about 10 atomic % and 20 atomic % $O_2$ and between about 10 atomic % $H_2$, followed by between about 60 atomic % and 80 atomic % $CHF_4$ with between about 10 atomic % and 20 atomic % $O_2$ and between about 10 atomic % $H_2$.

* * * * *